(12) United States Patent
Pevear et al.

(10) Patent No.: US 11,431,278 B2
(45) Date of Patent: Aug. 30, 2022

(54) SYSTEMS AND METHODS FOR ENERGY STORAGE AND POWER DISTRIBUTION

(71) Applicant: CABAN SYSTEMS, INC., Burlingame, CA (US)

(72) Inventors: Brian James Pevear, San Mateo, CA (US); Alexandra Rasch, San Francisco, CA (US)

(73) Assignee: CABAN SYSTEMS, INC., Burlingame, CA (US)

( * ) Notice: Subject to any disclaimer, the term of this patent is extended or adjusted under 35 U.S.C. 154(b) by 493 days.

(21) Appl. No.: 16/572,094

(22) Filed: Sep. 16, 2019

(65) Prior Publication Data

US 2020/0091855 A1 Mar. 19, 2020

Related U.S. Application Data

(60) Provisional application No. 62/732,132, filed on Sep. 17, 2018.

(51) Int. Cl.
| | |
|---|---|
| *H02S 10/10* | (2014.01) |
| *H01M 10/42* | (2006.01) |
| *H02J 13/00* | (2006.01) |

(Continued)

(52) U.S. Cl.
CPC .............. *H02S 10/10* (2014.12); *G01R 11/56* (2013.01); *H01M 10/4242* (2013.01);
(Continued)

(58) Field of Classification Search
CPC ......... H02S 10/10; H02S 40/38; G01R 11/56; G01R 19/2513; H01M 10/4242;
(Continued)

(56) References Cited

U.S. PATENT DOCUMENTS

| 8,423,199 B2 | 4/2013 | Kalén |
| 9,317,097 B2 * | 4/2016 | Chen ................. H02M 7/217 |

(Continued)

FOREIGN PATENT DOCUMENTS

| CA | 2840058 A1 * | 1/2013 | .............. H02J 3/006 |

OTHER PUBLICATIONS

Kwasinski et al., (Kwasinski) Operational aspects and power architecture design for a microgrid to increase the use of renewable energy in wireless communication networks, 2014, The 2014 International Power Electronics Conference, IEEE, pp. 2649-2655 (Year: 2014).*

(Continued)

*Primary Examiner* — M Baye Diao
(74) *Attorney, Agent, or Firm* — Willink & Hunt LLP; Marcus T. Hunt

(57) ABSTRACT

Energy storage and distribution systems are provided that comprises an energy storage device (e.g., one or more batteries) that can be used in conjunction with one or more electrical power sources—e.g., solar, wind, electric grid, fuel cell, or diesel. A controller is provided that manages energy storage and power distribution to loads, the energy storage device, or both. Energy storage and distribution systems can be configured to meter DC energy such that DC power usage for each load can be acquired. In this way, operators such as mobile network operators (MNOs) can be charged according to their DC power usages. Energy storage and distribution systems can also be configured to enable prioritized load shedding of one or more loads.

25 Claims, 6 Drawing Sheets

(51) Int. Cl.
  *G01R 11/56* (2006.01)
  *H02S 40/38* (2014.01)
(52) U.S. Cl.
  CPC .............. *H02J 13/00* (2013.01); *H02S 40/38* (2014.12); *H01M 2010/4271* (2013.01)
(58) Field of Classification Search
  CPC .... H01M 2010/4271; H02J 13/00; H02J 7/35; H02J 2300/10; H02J 2300/20; H02J 2310/10; H02J 2310/16; H02J 1/10; H02J 7/34; H02J 3/381; G06F 1/26; Y02E 10/50; Y02E 60/10; Y02E 70/30
  USPC ......................................................... 320/101
  See application file for complete search history.

(56) References Cited

U.S. PATENT DOCUMENTS

| | | | |
|---|---|---|---|
| 10,003,200 B2 * | 6/2018 | Budde | ........................ H02J 9/06 |
| D825,461 S | 8/2018 | Lundström | |
| 10,186,868 B2 | 1/2019 | Hansson et al. | |
| 10,666,047 B2 * | 5/2020 | Zubieta | ...................... G05F 1/12 |
| 2011/0221193 A1 | 9/2011 | Kalén et al. | |
| 2013/0342018 A1 | 12/2013 | Moon et al. | |
| 2016/0156195 A1 | 6/2016 | Kouno et al. | |
| 2016/0190822 A1 | 6/2016 | Lee et al. | |
| 2017/0129040 A1 | 5/2017 | Eulerich et al. | |
| 2017/0155253 A1 * | 6/2017 | Veda | ........................ H02J 13/00 |
| 2017/0237259 A1 | 8/2017 | Yoon et al. | |
| 2019/0380082 A1 * | 12/2019 | Kim | ...................... H04W 36/30 |

OTHER PUBLICATIONS

International Search Report and Written Opinion, International Application No. PCT/US2019/051348, dated Jan. 3, 2020, 12 pages.
Nnoli Kosisochukwu Pal et al., Technical Overview of All Sources of Electrical Power Used in BTSs in Nigeria, International Research Journal of Engineering and Technology (IRJET), Feb. 2017, pp. 18-30, vol. 4, issue 2, www.irjet.net.

* cited by examiner

SYSTEMS AND METHODS FOR ENERGY STORAGE AND POWER DISTRIBUTION

CROSS-REFERENCE TO RELATED APPLICATIONS

This application claims benefit under 35 U.S.C. § 119(e) of U.S. Provisional Application No. 62/732,132, filed Sep. 17, 2018, the entirety of which is incorporated herein by reference.

FIELD

The present disclosure relates generally to the field of energy, and more particularly to energy storage and power distribution for powering communications equipment in a wireless communication network.

BACKGROUND

In some locations and at various times, the electric grid capacity is insufficient to meet the energy needs of all customers. In some instances, the load demand may exceed the capacity of the grid. When this occurs, the grid may become unstable and/or unavailable, thereby depriving customers of electricity. The reasons for the lack of capacity are varied but usually relate to lack of sufficient capital to accommodate an ever-growing customer base. The telecommunications industry has traditionally relied on the electric grid to provide power to the many cellular base stations (or wireless base stations), which facilitate wireless communications. In cases where the grid is unstable, it is not rare for the cellular base stations to lose power. When this occurs, a diesel-burning generator is often used to supplement the grid to allow for the continuity of cellular service. Often, a battery is used to store energy to provide some level of backup that allows time for the generator to ramp up or in some cases, to allow for the grid to come back online. The burning of diesel fuel is expensive, noisy, and contributes to global warming.

The alternating current (AC) power provided by the grid is typically metered by an AC power meter so that a mobile network operator (MNO) (or operator) can be charged according to their AC energy usage. If more than one operator is located at a common geographic site, it is not rare to have more than one AC power meter to ensure that the operators are charged according to their distinct AC energy usage. In the case of telecommunications equipment, the AC power is rectified and used to power 48 Vdc loads, often corresponding to different operators with different power requirements for each load. If only one AC power meter is installed at an existing geographical site, such as a mobile (or cellular) tower, then the site is only equipped to provide power and monitor the energy usage of one operator. For a tower company, it is beneficial to provide service to multiple operators (or tenants) on a tower. To accommodate additional operators on the tower, additional AC power systems are installed, to include connections, metering, and backup energy. The owners of the AC power meter can often be a different company (e.g., the electric company owning the AC electricity grid) than the owners of the site (e.g., the tower company). The installation of the additional AC power systems is expensive, cumbersome, and requires logistical resources. Furthermore, certain geographical sites, whether existing or desired, may not have access to the electricity grid, and are thus unable to provide service without the use of a diesel generator. The cost of running a diesel generator for extended periods of time is costly, often prohibitively so.

Energy distribution systems are traditionally designed to provide power to all connected loads during operation. Individual loads may be manually shut off on-site by a technician for very few purposes limited to maintenance or repair of equipment owned by the operator or the tower company, or to terminate service of an operator.

SUMMARY

In one aspect, an energy storage and power distribution system for powering communications equipment in a wireless communication network is provided that includes: an energy storage device including one or more batteries; a controller coupled to the energy storage device and configured to couple to one or more electrical power sources; a plurality of load control interfaces coupled to the controller and configured to couple to the plurality of loads to enable distribution of DC power to the plurality of loads; and a DC metering module coupled to the plurality of load interfaces to acquire DC power usages for each of the plurality of loads. The controller is further configured to: control distribution of power from the one or more electrical power sources and power from the energy storage device to a plurality of loads; and charge the energy storage device with the power from the one or more electrical power sources In an embodiment, the energy storage and distribution system further includes: a transmitter coupled to the controller; and a remote server located remote from the energy storage device, the controller, the DC metering module, the plurality of load interfaces, and the transmitter. The controller is configured to transmit the DC power usages to the remote server via the transmitter. In an embodiment, the energy storage and distribution system further includes a database. The DC power usages for each of the plurality of loads are saved to corresponding load profiles stored in the database. The remote server is configured to generate billing invoices based on the DC power usages and the corresponding load profiles.

In an embodiment, the one or more electrical power sources include at least one selected from the group consisting of: solar panels, an AC electricity grid, a diesel generator, a fuel cell, and a wind turbine system. In an embodiment, the energy storage and distribution system further includes a DC/DC converter coupled to the controller. The one or more electrical power sources include the solar panels. The DC/DC converter is configured to couple to the solar panels to enable power distribution from the solar panels to the plurality of loads. In an embodiment, the energy storage and distribution system further includes: the solar panels coupled to the DC/DC converter; a transmitter coupled to the controller; and a remote server located remote from the energy storage device, the controller, the DC metering module, the plurality of load interfaces, and the transmitter. The controller is configured to transmit the DC power usages to the remote server via the transmitter.

In an embodiment, the controller is further configured to shed one or more of the plurality of loads based on configured load priority settings. In an embodiment, the controller is further configured to shed one or more of the plurality of loads based on a state of charge of the energy storage device.

In one aspect, a method of storing and distributing energy for communications equipment in a wireless communication network is provided that includes: activating, by a controller of an energy storage and power distribution system, one or more electrical power sources for power distribution to a plurality of loads; distributing, by the controller, DC power derived from the activated one or more electrical power sources to the plurality of loads; distributing, by the controller, a portion of the DC power derived from the activated one or more electrical power sources to an energy storage device to charge the energy storage device; and acquiring, by the controller, DC power usages for each of the plurality of loads from a DC metering module coupled to the plurality of load interfaces. The energy storage device includes one or more batteries. The energy storage and power distribution system includes: the energy storage device; the controller coupled to the energy storage device and configured to couple to the one or more activated electrical power sources; a plurality of load control interfaces coupled to the controller and configured to couple to the plurality of loads to enable distribution of DC power to the plurality of loads; and the DC metering module. The controller is further configured to: control distribution of power from the one or more electrical power sources and power from the energy storage device to a plurality of loads; and charge the energy storage device with the power from the one or more electrical power sources.

In an embodiment, the method further includes: receiving, by the controller, an indication to distribute power from the energy storage device to the plurality of loads; and distributing, by the controller, DC power from the energy storage device to the plurality of loads to power the plurality of loads.

In an embodiment, the method further includes: receiving, by the controller, an indication to stop distributing power from the energy storage device to the plurality of loads; and stopping distribution of the DC power from the energy storage device to the plurality of loads. In an embodiment, the method further includes: activating, by the controller, the one or more first electrical power sources for power distribution to a plurality of loads; and distributing, by the controller, DC power derived from the activated one or more electrical power sources to the plurality of loads. The distribution of DC power derived from the activated one or more electrical power sources to the plurality of loads deactivated when the DC power from the energy storage device is distributed to the plurality of loads to power the plurality of loads. In an embodiment, the one or more activated electrical power sources is selected from a plurality of electrical power sources coupled to the controller.

In an embodiment, the method further includes: configuring priority load settings in the energy storage and power distribution system; acquiring, by the controller, load parameters and energy storage device parameters for the plurality of loads and the energy storage device; and shedding, by the controller, one or more of the plurality of loads based on the configured load priority settings. In an embodiment, the shedding of the one or more plurality of loads is based on a state of charge of the energy storage device.

In one aspect, an energy storage and power distribution system for powering communications equipment in a wireless communication network is provided that includes: an energy storage device comprising one or more batteries; a controller coupled to the energy storage device and configured to couple to one or more electrical power sources; a plurality of load control interfaces coupled to the controller and configured to couple to the plurality of loads to enable distribution of DC power to the plurality of loads. The controller is further configured to: control distribution of power from the one or more electrical power sources and power from the energy storage device to a plurality of loads; and charge the energy storage device with the power from the one or more electrical power sources. The controller is configured to shed one or more of the plurality of loads based on configured load priority settings.

In an embodiment, the controller is further configured to shed one or more of the plurality of loads based on a state of charge of the energy storage device. In an embodiment, the energy storage and distribution system further includes: a transmitter coupled to the controller; and a remote server located remote from the energy storage device, the controller, the plurality of load interfaces, and the transmitter. The controller is further configured to: shed one or more loads of the plurality of loads in response to receiving an external command from the remote server; and transmit load status data to the remote server.

In an embodiment, the configured priority load settings include at least one selected from the group consisting of: settings based on load attributes for the plurality of loads; and settings based on an operator priority for one or more operators of the plurality of loads. In an embodiment, the configured priority load settings include settings based on wireless network technologies employed in the plurality of loads. The plurality of loads includes: a first load comprising first base transceiver station (BTS) equipment employing a first wireless network technology; and a second load comprising second base transceiver station (BTS) equipment employing a second wireless network technology. The first and second wireless network technologies are selected from the group consisting of: second-generation (2G), third-generation (3G), fourth-generation (4G), and fifth-generation (5G) mobile network technologies.

In one aspect, a method of shedding loads with an energy storage and power distribution system for communications equipment in a wireless communication network is provided that includes: configuring priority load settings in an energy storage and power distribution system; acquiring, by the controller, load parameters and energy storage device parameters for the plurality of loads and the energy storage device; and shedding, by the controller, one or more of the plurality of loads based on the configured load priority settings. The energy storage and power distribution system includes: an energy storage device comprising one or more batteries; a controller coupled to the energy storage device and configured to couple to one or more electrical power sources; and a plurality of load control interfaces coupled to the controller and configured to couple to the plurality of loads to enable distribution of DC power to the plurality of loads. The controller is further configured to: control distribution of power from the one or more electrical power sources and power from the energy storage device to a plurality of loads; and charge the energy storage device with the power from the one or more electrical power sources.

In an embodiment, the method of further includes acquiring, by the controller, a state of charge of the energy storage device. The shedding of one or more of the plurality of loads is based on the state of charge of the energy storage device. In an embodiment, the method further includes shedding, by the controller, one or more loads of the plurality of loads in response to receiving an external command. The energy storage and power distribution system further includes: a transmitter coupled to the controller; and a remote server located remote from the energy storage device, the controller, the plurality of load interfaces, and the transmitter. The controller is further configured to: shed one or more loads of the plurality of loads in response to receiving the external command from the remote server; and transmit load status data to the remote server.

In an embodiment, the configured priority load settings include at least one selected from the group consisting of: settings based on load attributes for the plurality of loads; and settings based on an operator priority for one or more operators of the plurality of loads. In an embodiment, the configured priority load settings include settings based on wireless network technologies employed in the plurality of loads. The plurality of loads includes: a first load comprising first base transceiver station (BTS) equipment employing a first wireless network technology; and a second load comprising second base transceiver station (BTS) equipment employing a second wireless network technology. The first and second wireless network technologies are selected from the group consisting of: second-generation (2G), third-generation (3G), fourth-generation (4G), and fifth-generation (5G) mobile network technologies.

BRIEF DESCRIPTION OF THE DRAWINGS

For a better understanding of at least an embodiment, reference will be made to the following Detailed Description, which is to be read in conjunction with the accompanying drawings, wherein.

DETAILED DESCRIPTION

Figure 1:
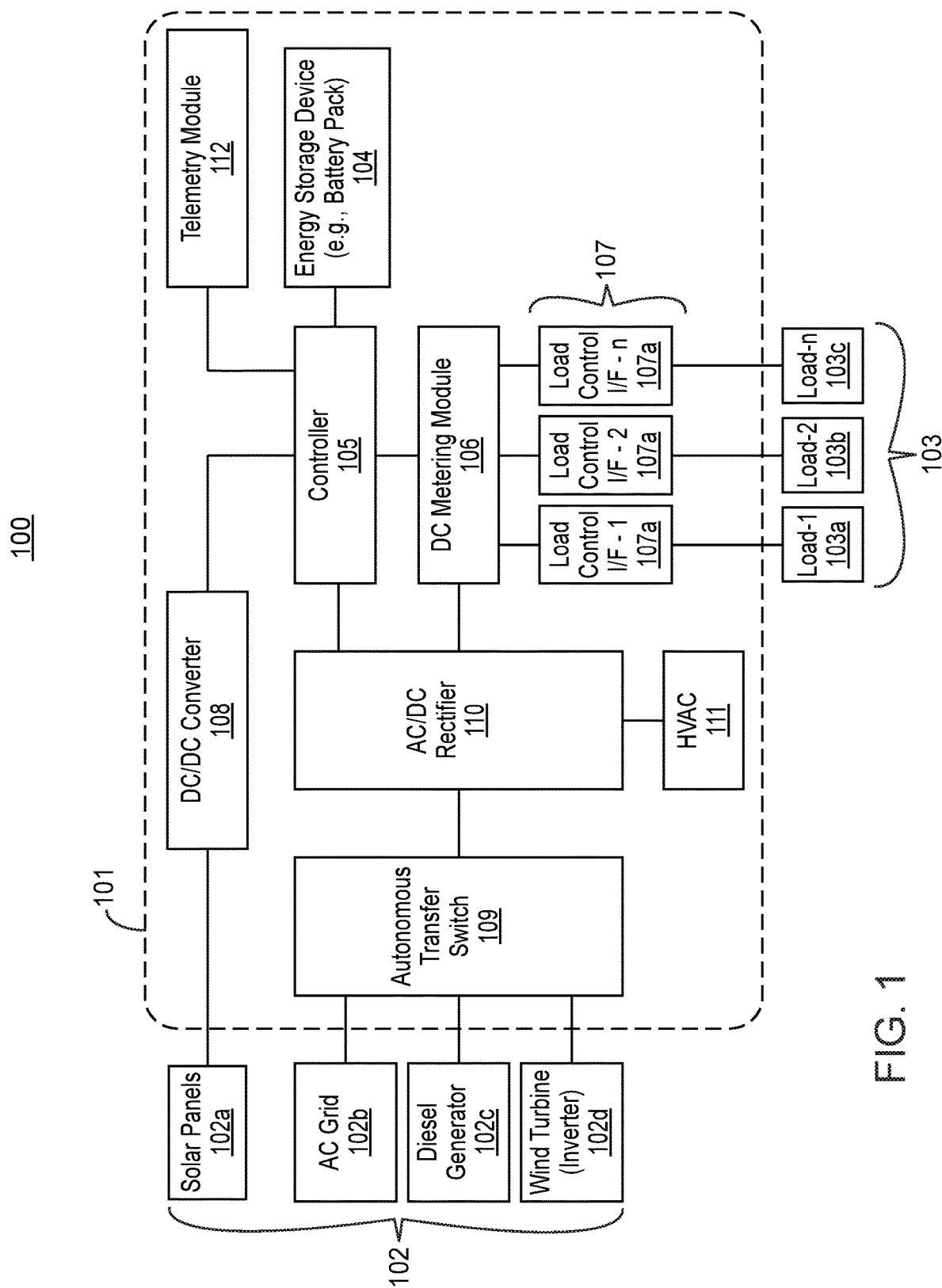
FIG. 1 illustrates a block diagram of an example energy system 100, according to an embodiment.

Before aspects of the present disclosure are described below with reference to the drawings in the description, common features may be designated by common reference numbers. Although certain examples are described herein with reference to a system, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more conditions, or events not explicitly recited. As used herein, "exemplary" may indicate an example, an implementation, and/or an aspect, and should not be construed as limiting or as indicating a preference or a preferred example, implementation, and/or aspect.

Energy distribution systems can have a huge impact on the environment, and thus can play a critical role to preserve our environment, reduce pollutants, and mitigate global warming. Many energy distribution systems today rely on diesel fuel as an electrical power source or back-up electrical power source. However, the burning of diesel fuel is expensive, noisy, and contributes to global warming. In one aspect of the present disclosure, energy storage and power distribution systems for powering communications (or telecommunications) equipment in a wireless communication network are provided that reduce or eliminate the need to burn diesel while meeting the power (or energy) needs of various operators.

Colocation of power at a single site with multiple operators is traditionally implemented in distribution systems where the AC electricity grid provides power and AC meters are installed to track AC energy usage and charge operators appropriate to their energy usage. As previously discussed, relying on AC meters to track an operator's energy usage can be limiting or present issues when only a single AC meter is installed at an existing site and multiple tenants are desired, when no AC power source is present at an existing site, when no AC power source is available at a desired site, etc. In one aspect, energy conservation and power distribution systems for powering communications equipment in a wireless communication network are provided that enable power (or energy) usage to be tracked for each load (or operator) without reliance on AC power meters.

As mentioned above, traditional energy distribution systems enable a load to be manually shut of on-site by a technician for very limited instances, such as repair or maintenance of equipment, or termination of service. In one aspect, energy storage and distribution systems for powering communications equipment in a wireless communication network are provided that enable one or more loads to be dynamically shed during operation when energy conservation is required or beneficial. The terms "shed" and "load shedding" are used herein to refer to the disabling of power distribution to one or more of the loads (or to shut off power to one or more loads), such as by electrical disconnection for instance. Load shedding is important because some loads are more critical than others. The critical loads can have more severe consequences if power to the load is lost. With a finite energy reserve, it can be important to conserve energy for the loads with a higher priority.

Most telecommunications towers presently utilize an electrical system comprised of the AC electricity grid, AC/DC rectifiers, lead-acid batteries, and a diesel generator. There are several shortcomings to such traditional systems. One shortcoming of the systems is that it does not account for remote sites where cellular service is desired but electric grid capacity does not exist. These sites, which must rely on renewable sources, do not benefit from AC metering of power. In one aspect, an energy storage and distribution system (and techniques related thereto) is provided that enable a new way to address the need for metering of power at these remote sites—via DC metering of the power distributed to each load. Another shortcoming of the traditional systems is that, AC power is individually metered for each operator at a given site, with each individual operator providing its own rectification, energy storage, and generator backup. In one aspect, an energy storage and distribution system (and techniques related thereto) is provided that includes one or more renewable electrical power sources (e.g., solar panels, wind turbine, fuel cell, etc.) that predominantly generate power to the loads at these remote sites. In one embodiment, the energy storage and distribution system further includes one energy storage device comprising one or more batteries, one rectifier system, and one generator. Yet another shortcoming to the traditional systems is that the cost of using diesel to power remote sites is very high. As the demand for electricity increases, it is not uncommon for some of these telecommunications sites to operate diesel generators in a nearly continuous fashion. The logistic expense of providing the required fuel is considerable. Any system that can decrease the duty cycle of a diesel generator should be considered an improvement. In one aspect, an energy storage and distribution system (and techniques related thereto) is provided that eliminates or reduces the need to burn diesel at these remote sites. It should be appreciated that the energy storage and distribution system (and techniques related thereto) can also apply to electrical loads at other locations or sites, such as a business or residence located in an area that is not well supported by the AC electrical grid. Similar principles can be applied with the inclusion of a proper electrical converter.

In one aspect, an energy storage and distribution system is provided that comprises an energy storage device (e.g., one or more batteries) that can be used in conjunction with various electrical power sources—e.g., solar, wind, electric grid, fuel cell, or diesel. In one aspect, an intelligent controller is provided that manages energy storage and power distribution according to the optimal needs of operators of one or more loads. In one aspect, the power (or energy) is distributed according to dynamically configurable settings to enable prioritized load shedding of one or more loads (e.g., 24 Vdc or 48 Vdc equipment). In one aspect, since the distribution of power occurs on the "DC side," the DC energy is metered such that the DC power usage (or DC energy usage) for each load can be acquired. In one aspect, the DC power usages or other system data can be communicated to a remote server in real-time. Based on the real-time data, the system can be managed remotely to improve reliability, reduce maintenance, and reduce operating costs. Furthermore, the remote server can utilize the DC power usages per load (or customer) to generate billing invoices so operators are charged according to their distinct DC power usage, which is a direct measurement for their energy usage. In one aspect, an energy storage and distribution system is provided that is modular and configurable. For example, system components can be selected based on the load requirements, cost restrictions, desired usage, available or desired electrical power sources, etc.

FIG. 1 illustrates a block diagram of an example energy system 100, according to an embodiment. The energy system 100 is shown including an energy storage and power distribution system 101, electrical power sources 102, and a plurality of loads 103 (or n number of loads). The energy storage and power distribution system 101 is electrically coupled to the electrical power sources 102 and to the loads 103.

The electrical power sources 102 are shown including four example electrical power sources: solar panels 102a (or solar system including a plurality of solar cells), an alternating current (AC) electricity grid 102b, a diesel generator 102c, and a wind turbine 102d. The electrical power sources 102 shown are illustrative examples and not exhaustive. One or more of the electrical power sources 102 can be implemented, alone or in various combinations, and coupled to the energy storage and power distribution system 101. Further, electrical power sources other than those shown can be implemented in other embodiments without compromising the underlying principles of the present disclosure. For example, another type of DC generating power source, such as a fuel cell, can be implemented and coupled to a DC/DC converter coupled to the controller, similar to the solar panels 102a and the DC/DC converter 108 shown in FIG. 1. Other types of generators (AC or DC) can also be implemented, such as a bio-fuel generator.

The loads 103 are shown including n loads 103a, 103b, and 103n in FIG. 1. The number of loads (e.g., two or more) can vary in different implementations, such as two or more loads. The loads 103 can include communications equipment (e.g., telecommunications equipment) for a wireless communication network. For example, one or more of the loads 103 can include a base transceiver station (BTS) (or wireless base station) that facilitates wireless communication between user equipment and a wireless network. The BTS can include, for instance, a transceiver, power amplifier, antenna, baseband receiver unit, among many other necessary components to facilitate wireless communication. The communications equipment (e.g., BTS) can employ various wireless (or broadband, mobile, cellular, etc.) communication technologies, including variations in wireless communication standards, such as standards set forth by the International Telecommunications Union for instance. Illustrative examples of wireless communication technologies can include, but are not limited to: Global System for Mobile Communications (GSM); Universal Mobile Telecommunications System (UMTS); code-division multiple access (CDMA); CDMA2000; wide area network (WAN); Long-Term Evolution (LTE); LTE Advanced Pro; and other second-generation (2G), third-generation (3G), fourth-generation (4G), and fifth-generation (5G) mobile or cellular network technologies; etc. Technologies other than those listed can also be applicable.

The energy storage and power distribution system 101 is shown including an energy storage device 104, a controller 105, a DC metering module 106, load control interfaces 107, a DC to DC (DC/DC) converter 108, an autonomous transfer switch (ATS) 109, an AC to DC (AC/DC) rectifier 110, and a heating ventilation and air conditioning (HVAC) module 111, and a telemetry module 112. The energy storage device 104 includes one or more batteries (or battery pack). For example, the energy storage device 104 can include multiple batteries connected in series to generate the required output voltage and current for the loads 103, such as −24 volts or −48 volts for instance. The type of batteries implemented can vary and can include lithium-ion batteries, lead acid based (or Pb-based) batteries, etc. In one embodiment, the batteries are lithium-ion batteries. Lead acid based batteries can possess attributes that are non-ideal—e.g., the life-cycling capability of lead acid batteries is relatively poor; the replacement costs are high, especially for remote sites, and they are prone to theft due to their relative ease of use. Lithium-ion based batteries possess excellent cycling capabilities and can be disabled when removed from the host system. Lithium-ion based batteries can enable improvements in reliability and ultimately a reduction in operating expenses. The energy storage device 104 is electrically coupled to the controller 104 and is configured to provide power to the loads 103 via the load-control interfaces 107.

The load control interfaces 107 couples the energy storage and power distribution system 101 to the loads 103. The load control interfaces 107 are used to monitor the power usage of the loads and to enable or disable a given load. For example, the load control interfaces 107 can include electrical connections that couple the energy storage and power distribution system 101 to the loads 103. The load control interfaces 107 can include a switch (e.g., a manual disconnect switch, a resettable circuit breaker, or a relay) to enable and disable the distribution of power to one or more of the loads 103. References to a load being "enabled" are used herein to mean that the load is electrically connected (or energized) and receives power from the energy storage and distribution system. References to a load being "disabled" are used herein to mean that the load is electrically disconnected (or denergized) and does not receive power from the energy storage and distribution system. These switches can be controlled accordingly (e.g., by the controller 105) to shed one or more loads as desired, such as when a state of charge (SOC) of the energy storage device 104 is below a threshold value required for the loads 103, or upon an external command to shed a load.

The DC metering module 106 is coupled to the load control interfaces 107 and enables DC power usage to be acquired for each load. For example, the DC metering module 106 can include a DC meter for each load that measures the voltage and current output to the load. DC power usage (or DC power measurements) for each load can be generated based on the voltage and current measurements. The DC power usage can be generated by the DC metering module 106, or by the controller 105 that receives the voltage and current measurements from the DC metering module 106.

The controller 105 is electrically coupled to the electrical power sources 102 via the ATS 109 and the AC/DC rectifier 110. The controller 105 is also electrically coupled to the energy storage device 104 and to the loads 103 via the load control interfaces 107. The controller 105 controls the distribution of power within the energy storage and power distribution system 101. For example, the controller 105 controls the distribution of power from the electrical power sources 102 to the loads to power the loads; from the electrical power sources 102 to the energy storage device 104 to charge the energy storage device 104; and from the energy storage device 104 to the loads 103 to power the loads 103 with the energy storage device 104.

The controller 105 is shown electrically coupled to the solar panels 102a via the DC/DC converter 108. In one embodiment, the DC/DC converter 108 is a front end DC/DC converter employing a Maximum Power Point Tracking (MPPT) algorithm to efficiently extract the photovoltaic (PV) output power from the solar panels and convert the PV output voltage to the required voltage to power the loads 103, charge the energy storage device 104, or both. The controller 105 controls the distribution of power from the DC/DC converter 108 to the loads 103 and to the energy storage device 104.

The controller 105 is shown electrically coupled to the AC electricity grid 102b, diesel generator 102c, and the wind turbine 102d via the ATS 109 and the AC/DC rectifier 110. The AC/DC rectifier 110 takes AC power generated by the AC electricity grid 102b, diesel generator 102c, and the wind turbine 102d and converts it to DC power. The ATS 109 is coupled to the electrical power sources 102 and functions as an electrical switch that enables switching between the electrical power sources 102b, 102c, and 102d. The controller 105 can communicate with the ATS 109 to select which of the electrical power sources 102b, 102c, and 102d to activate for power distribution to the loads 103 and the energy storage device 104. For instance, the controller 105 controls the distribution of power (e.g., DC power) generated from the AC/DC converter 110 to the loads 103 to power the loads 103, and to the energy storage device 104 to charge the energy storage device 104. References to an electrical power source being "activated" or "activated for power distribution" are used herein to mean that the energy storage and power distribution system activates the electrical connection to the electrical power source such that power from the electrical power source is distributed to the loads, to the energy storage device, or both. Similarly, references to an electrical power source being "deactivated" or "deactivated for power distribution" are used herein to mean that the energy storage and power distribution system deactivates the electrical connection to the electrical power source such that power from the electrical power source is not distributed to the loads, to the energy storage device, or both. These references are not intended to refer to the powered state of the electrical power source itself, which may or may not remain powered when the electrical power source is deactivated.

The energy storage and power distribution system 101 is configured to supply the load at desired load voltages. It should be appreciated that several loads can be supported with distinct control for each. In an embodiment, solar panels 102a provide power to the loads 103, and excess power from the solar panels 102a is used to charge the energy storage device 104. If one or more AC-generating electrical power sources are implemented (e.g., the AC electricity grid 102b, wind turbine 102d, etc.), then the AC power can be rectified to power the loads 103. If there is excess power derived from the AC-generating electrical power sources, such power can be used to charge the energy storage device 104. If the power from the AC-generating electrical power sources is insufficient to power the loads, then power from the energy storage device 104 can be distributed to the loads 103. In one embodiment, as the energy storage device 104 is discharged, the state of charge of the energy storage device 104 is monitored. The state of charge can be monitored to shed loads when the state of charge is low (e.g., below a threshold) such that the remaining energy is allocated to loads with greater priority (e.g., according to configured load priority settings). In one embodiment, when the battery packs discharge to the point of being nearly depleted, a signal can be provided to turn on a generator (e.g., the diesel generator 102c). In this manner, the system can be configured to minimize or optimize the use of the generator.

The telemetry module 112 includes a transceiver (or transmitter) to communicate with a remote server (e.g., remote server 304 of FIG. 3) that is remote from the energy storage and power distribution system 101. For example, the energy storage and power distribution system 101 can be located adjacent a tower (e.g., tower 201 of FIG. 2) and coupled to communications equipment (e.g., telecommunications equipment such as BTSs) adjacent to and disposed on the tower. The electrical power sources 102 (or connections thereto) can be located near or on the tower. The telemetry module 112 can communicate with the remote server via a wired or wireless network, such as the Internet.

The controller 105 communicates system data related to the energy storage and power distribution system 101 to the remote server via the telemetry module 112. The term "system data" is used herein to refer generally to any data related to the energy storage and power distribution system, the loads, and the electrical power sources. The system data can include, for example, data related to the loads 103 (also referred to herein as "load data"), the energy storage device 104 (also referred to herein as "energy storage device data"), and the electrical power sources 102 (also referred to herein as "electrical power sources data"), and status (or states) of the system or components. The load data can include, for instance, parameters (e.g., measurement and information) related to the operation and status of the loads 103, such as voltage measurements, current measurements, DC power usage (or calculations), temperature measurements, humidity measurements, status (or state) of the loads 103 (also referred to herein as "load status data"). The energy storage device data can include, for instance, parameters (e.g., measurement and information) related to the operation and status of the electrical power sources 102, such as when the energy storage device 104 was active, how long it was active, various measurements (voltage, current, and DC power output), state of charge of the energy storage device 104, status of the energy storage device 104 (e.g., enabled or disabled, operating within limits, operating outside limits, etc.), etc. The electrical power sources data can include, for instance, parameters (e.g., measurement and information) related to the operation and status of the electrical power sources 102, such as which electrical power sources were active, how long each was active, various measurements (voltage, current, and DC power output), status of the electrical power sources, etc. The system data can be collected continuously (e.g., in real time), at predetermined times, or on demand. Incoming data can be received by the controller 105 via the telemetry module 112 and can include data such as operational commands (e.g., requests for various data, commands to shed loads, software updates, etc.) send from the remote server or the user device, for instance. Having bi-directional control enables various actions to be initiated remotely and implemented within the energy storage and power distribution system in real-time. Example actions can include, but are not limited to, adjusting settings described herein (e.g., load priority settings or charge settings), adjust various threshold settings, adjust selection settings for electrical power sources, etc.

The HVAC module 111 regulates the temperature within the energy storage and power distribution system 101 to ensure the system 101 stays within operational temperature ranges and does not overheat. The HVAC module 111 is shown electrically coupled to the AC/DC converter 110 and powered by the power output by the AC/DC converter 110.

Figure 2:
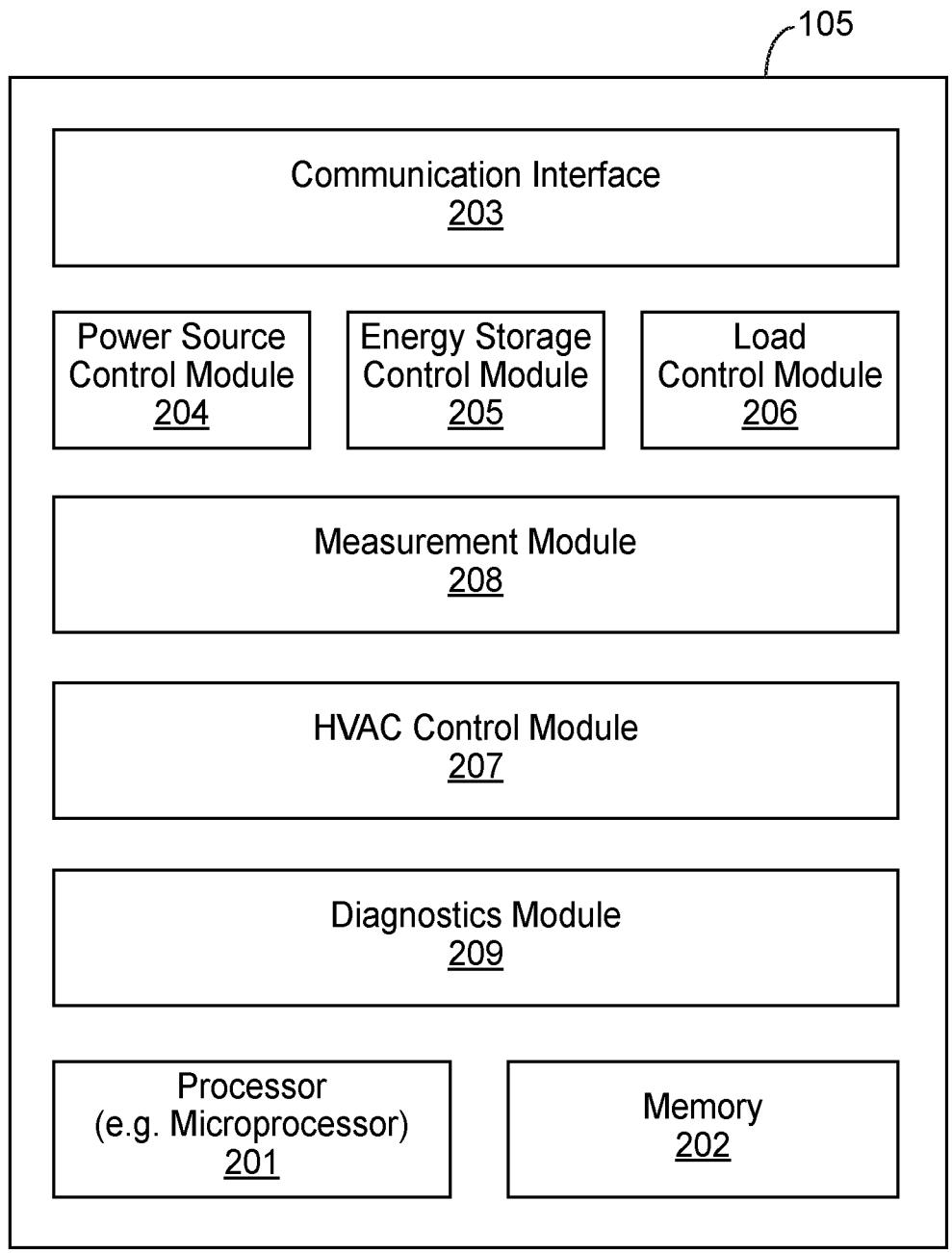
FIG. 2 illustrates a block diagram of an example controller of an energy storage and power distribution system, according to an embodiment.

FIG. 2 illustrates a block diagram of an example controller of an energy storage and power distribution system, according to an embodiment. The controller 105 is shown including a processor (e.g., a microprocessor) 201 and memory 202. The memory can include volatile and non-volatile memory, which can be used to store various system data and computer programs adapted to run on the processor 201. The controller 105 can be provided in the form of hardware or combination of hardware and software. The methods and features of the controller described herein can be embodied in hardware in the controller 105, as a computer program (e.g., stored in the memory 202) adapted to run on the microprocessor 201 comprised in the controller 105, or combination thereof.

The controller 105 is shown including communications interface 203 that enables the controller to electrically couple to various components of the energy storage and power distribution system 101, such as the energy storage device 104, the AC/DC rectifier 110, the DC/DC converter 108, the telemetry communications interface 315, the DC metering module 106, various sensors (e.g., temperature, humidity, etc.), the ATS 109, the HVAC 111, the load control interfaces 107, the loads 103 (e.g., via the load control interfaces 107), etc. The communications interface 203 can include one or more interfaces, such as interface connections to one or more busses, electrical pathways, etc., coupled to the various components of the energy storage and power distribution system 101. The controller 105 is shown including a control module 204, an energy storage control module 205, a load control module 206, and a measurement module 208, which work closely in conjunction with each other to control distribution of power within the energy storage and power distribution system 101.

The power source control module 204 controls the activation and deactivation of power distribution from the electrical power sources 102. For example, the power source control module 204 selects which electrical power source 102 to activate to power the loads 103 and the energy storage device 104. The power source control module 204 monitors and controls the output voltages and currents from the electrical power sources 102. For example, the power source control module 204 monitors and controls the output voltage and current from the AC/DC rectifier 110 (e.g., for the AC electricity grid 102b, the diesel generator 102c, and the winder turbine 102d) in a manner to optimally power the loads 103 and charge the energy storage device 104. The power source control module 204 also monitors and controls the output voltage and current from the DC/DC converter 108 in a manner to optimally power the loads 103 and charge the energy storage device 104.

The power source control module 204 selects which of the electrical power sources 102 to utilize to charge the energy storage device 104. For example, the power source control module 204 can be configured to charge the energy storage device 104 with power from the electrical power source 102 that is actively powering the loads 103. Alternatively, the power source control module 204 can be configured to charge the energy storage device 104 with power from one of the electrical power sources 102 that is not actively powering the loads 103. For instance, power from the solar panels 102a can be used to charge the energy storage device 104 while the AC electricity power grid is powering the loads 103. In an embodiment, the power source control module 204 can be configured to simultaneously power the loads 103 with more than one of the electrical power sources 102 and the energy storage device 104. For example, power from the energy storage device 104 can be utilized to supplement power from the solar panels 102a when the solar panels 102 are insufficient to fully power the loads 103. As another example, the wind turbine 102d can be utilized to supplement power from the AC electricity grid 102b when the AC electricity grid is insufficient to fully power the loads 103.

The energy storage control module 205 monitors and controls power distribution from the energy storage device 104. For example, the energy storage control module 205 activates and deactivates power distribution from the energy storage device 104. The energy storage control module 205 can control when the energy storage device powers the loads 103. The energy storage control module 205 can be configured to distribute power from the energy storage device 104 to the loads 103 at various times (e.g., upon occurrences of specific events)—e.g., when power from the electrical power sources 103 is insufficient to power the loads 103, when switching between power from different electrical power sources 102 (e.g., from AC electricity grid 102b to solar panels 102a), or other times as configured for an intended design or application. The energy storage control module 205 can control when the electrical power sources 102 charge the energy storage device 104. For example, the controller can be configured to only charge the energy storage device 104 if it requires charging.

The load control module 206 monitors and controls power distribution to the loads 103. For example, the load control module 206 can communicate with load control interfaces 107 to receive data pertaining to the loads 107 (also referred to herein as "load data"), to enable or disable one or more of the loads 103 from receiving power, etc. The load data can include, for example, DC voltages and currents that are delivered to each of the loads 103, DC power usages for each of the loads 103, temperatures associated with each of the loads 103, etc.

The load control module 206 works in conjunction with the power source control module 204 and the energy source control module 205 to select which of the electrical power sources 102 and the energy storage device 104 is used to power the loads 103 and in what order (e.g., primary, initial back-up, secondary back-up, etc.). In one example embodiment, for instance, the AC electricity grid 102 can be the primary power source for the loads 103, with the solar panels 102a and the wind turbines 102d providing initial back-up power for the AC electricity grid 102, with the energy storage device 104 providing secondary back-up power for the solar panels 102a and the wind turbines 102d, and with the diesel generator 102c providing final back-up power when the energy storage device 104 becomes insufficient to power the loads 103. It should be appreciated that other orders of operation can be implemented in other embodiments. It is also appreciated that a different number and combination of electrical power sources can be implemented than what is shown in FIG. 1. For example, in another example embodiment, the energy storage and power distribution system 101 is coupled to solar panels 102a and not to any of the electrical power sources 102, with the energy storage device 104 serving as a back-up power source when power from the solar panels 102a is insufficient to power the loads 103. It is also appreciated that electrical power sources other than those shown in FIG. 1 can also be implemented in other embodiments.

The load control module 206 controls when one or more of the loads 103 is enabled or disabled. For example, the load control module 206 can send control signals to the load control interface 107 to enable or disable power distribution to each the loads 103. The load control module 206 can be configured to select which loads are disabled or enabled based on priority load settings. The priority load settings can be stored in the memory 202 configured by a technician or system administrator or determined by software based on a power conservation algorithm that maximizes the conservation and efficiency of the energy storage and power distribution. The priority load settings can vary based on intended design or application. The following examples are illustrative and not exhaustive. For example, the priority load settings can indicate which loads are considered for shedding, and what order to shed the loads. For instance, the priority load settings can assign a priority to each load, shedding loads with lower priorities before loads with higher priorities. The priority load settings can indicate one load or multiple loads to shed, and further can indicate the order in which the multiple loads are shed. The priority load settings can prioritize loads based on attribute of the loads (also referred to herein as "load attributes"), such as the type of wireless technology employed in the loads. For instance, each of the loads 103 can include communications equipment (e.g., a BTS) that operates using second-generation (2G), third-generation (3G), fourth-generation (4G), or fifth-generation (5G) mobile (or cellular) network technologies; and further, the priority load settings can indicate that only loads at the lowest generation network technology (e.g., 2G) be shed. The priority load settings can prioritize loads for shedding based on how much power is required by the load, the importance (e.g., the severity of consequence) for a load to remain active, operator preference, how much power a load consumes, loads having service to a greater user base or geographic area; etc. The priority load settings can prioritize loads based on attributes of their associated operator (or customer). For instance, the priority load settings can prioritize loads for shedding based on an operator priority by shedding loads for operators with lower operator priority while maintaining loads active for customers with higher operator priority. In some instances, the operator priorities can be based on the importance (e.g., the severity of consequence) of the operator's service, the customer's subscription (e.g., better subscriptions having greater assurances that their load remains powered), etc.

The measurement module 208 acquires system parameters, such as measurements and calculations for the energy storage and power distribution system 101 and the loads 103. For example, the measurement module 208 can acquire voltage, current, power, and temperature measurements from the energy storage device 104, the DC metering module 106, and the loads 107. The measurements module 208 can calculate the DC power usage per load (or DC energy usage for a given time period) based on the DC voltage and current readings from the DC metering module 106. The measurement module 208 can store the measurements in the memory 202 or instruct the telemetry module 112 to transmit the measurements to a remote server (e.g., the remote server 304 of FIG. 3) to be stored in a database (e.g., the database 305 of FIG. 3)—e.g., as part of a load profile that can be used to generate billing invoices for operators of the loads 103.

The controller 105 is shown including a diagnostics module 209 that performs diagnostic testing related to the energy storage and power distribution system 101. The diagnostics module 209 can generate diagnostic data, which can be sent to a remote server (e.g., remote server 304 of FIG. 3), or communicated to a user device (e.g., user device 306 of FIG. 3) that a technician can use to communicate with the energy storage and power distribution system 101 via the telemetry module 112, for instance. The controller 105 is shown also including an HVAC control module 207 that monitors and controls the HVAC module 111 to maintain the temperature of the energy storage and power distribution system 101 within desired operating ranges. The HVAC unit 111 can include or be coupled to various sensors, such as temperature and humidity sensors.

Figure 3:
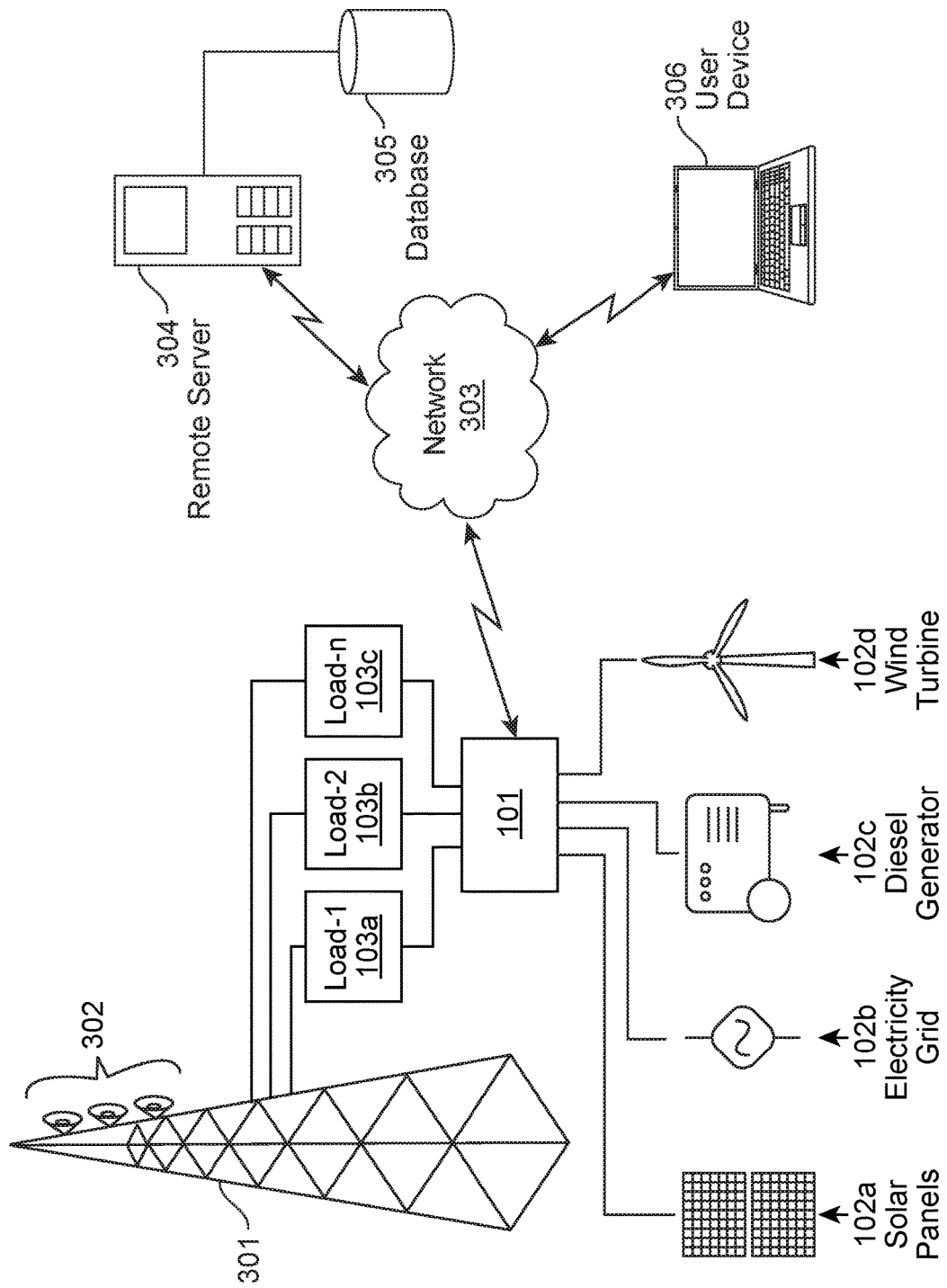
FIG. 3 illustrates a block diagram of an example system including an energy storage and power distribution system, according to an embodiment.

FIG. 3 illustrates a block diagram of an example system including an energy storage and power distribution system, according to an embodiment. In FIG. 3, a system 300 is shown including the energy storage and distribution system 101 electrically coupled to the electrical power sources 102 (e.g., 102a, 102b, 102c, and 102d) and to the loads 103 (e.g., 103a, 103b, and 103n), which can include telecommunications equipment coupled to a tower 301. The telecommunications equipment can include BTS, for instance. Some or all of the telecommunications equipment can be disposed on or next to the tower 301. Antennas 302, which can be considered part of the loads 103, are shown coupled to the tower 301 and include antennas 302 for each of the loads 103. The energy storage and distribution system 101 is coupled to the tower 301 and can be disposed on or next to the tower 301 for instance.

The energy storage and distribution system 101 is shown communicatively coupled to a network 303, which can include one or more wired or wireless networks, such as the Internet. The energy storage and distribution system 101 is communicatively coupled to a remote server 304, which is also coupled to the network 303. The remote server 304 is shown including a database 305, which can be part of the remote server 304 or external or remote from the remote server 304. A user device 306 is also shown coupled to the network 303 and can be configured to communicate with the remote server 304, the energy storage and power distribution system 101, or both. The user device can be operated by a technician or system administrator, for instance, to generate commands or queries for the remote server 304 to send to the energy storage and power distribution system 101, or to generate commands sent directly to the energy storage and power distribution system 101. The commands or queries can include, for example, commands to shed loads, commands to activate or deactivate electrical power sources 102, requests for system data, diagnostic testing, etc.

The controller 105 can be configured to communicate the system data to the remote server 304 for storage in the database 305. For example, the load data and the energy storage device data (e.g., DC power usages for each of the loads) can be communicated to the remote server 304 and saved within load profiles maintained in the database 305. The load profiles for each load 103 can be maintained to track each load's DC power usage. If, for example, a single operator utilizes each of the loads 103, then the DC power usages for each of the loads 103 can be measured and saved to the corresponding load profile to determine the DC power usage per load. The load profiles can also be assigned to operators (or customers, tenants, etc.). For example, if different operators utilize each of the loads 103, then the load profiles can represent the corresponding customers to calculate the DC power usage per customer. If the loads are utilized by multiple operators with some operators utilizing multiple loads, then the load profiles can include DC power usages on both a per load and per customer basis. The remote server can utilize the load profiles to generate various reports, billing invoices for operators, etc. In an embodiment, the raw data (e.g., load voltages, current, power usage, etc.) can be sent to the remote server 304 for processing to reduce the processing required by the controller 105. An application programming interfaces (API) can be utilized to develop software applications, for example, that use the raw data. The user device 306 can be configured to run a browser application on the user device 306, for example, to access various applications (e.g., web pages) including information related to the operator's service, such billing information, power usage information, dashboard summaries, etc.

It should be appreciated that more than one energy storage and power distribution system 101 can be implemented at different locations and coupled to the network 303 to communicate with the remote server 304. For example, energy storage and power distribution system 101 can be implemented at different tower locations established by a tower company. Furthermore, it should be appreciated that more than one server 304, database 305, and user device 306 can be implemented without compromising the underlying principles of the disclosure.

In an embodiment, the energy storage and power distribution system 101 can be disposed in a housing (or enclosure), such as an enclosed chassis. The housing can be made from any variety of materials, but is preferably made from a durable material that can protect the system, such as metals or metal alloys that can also include various coatings of polymers for additional protection in some instance. In this way, the energy storage and power distribution system 101 can be coupled to an existing or new site (e.g., mobile tower). For example, the housing be located near or on the tower. In one embodiment, the energy storage and power distribution system 101 can be removably coupled to the tower, making the energy storage and power distribution system 101 portable and able to be moved to a different location if needed.

In an embodiment, the energy storage and power distribution system 101 can include one or more of the electrical power sources 102 that do not exist at an existing or new site. The energy storage and power distribution system 101 can then be installed at the site to provide one or more additional electrical power sources. For example, in one embodiment, the energy storage and power distribution system 101 can include the solar panels 102a. In such case, for example, the energy storage and power distribution system can be installed at an existing tower site having existing electrical power sources already employed (e.g., the AC electricity grid and diesel generators) to power the loads. The diesel generators can then be eliminated or used as a last alternative to conserve energy and costs. As another example, the energy storage and power distribution system including the solar panels can be installed at a remote site where the AC electricity grid is unavailable, and supply power to the loads via the solar panels 102a and the energy storage device 104.

Figure 4:
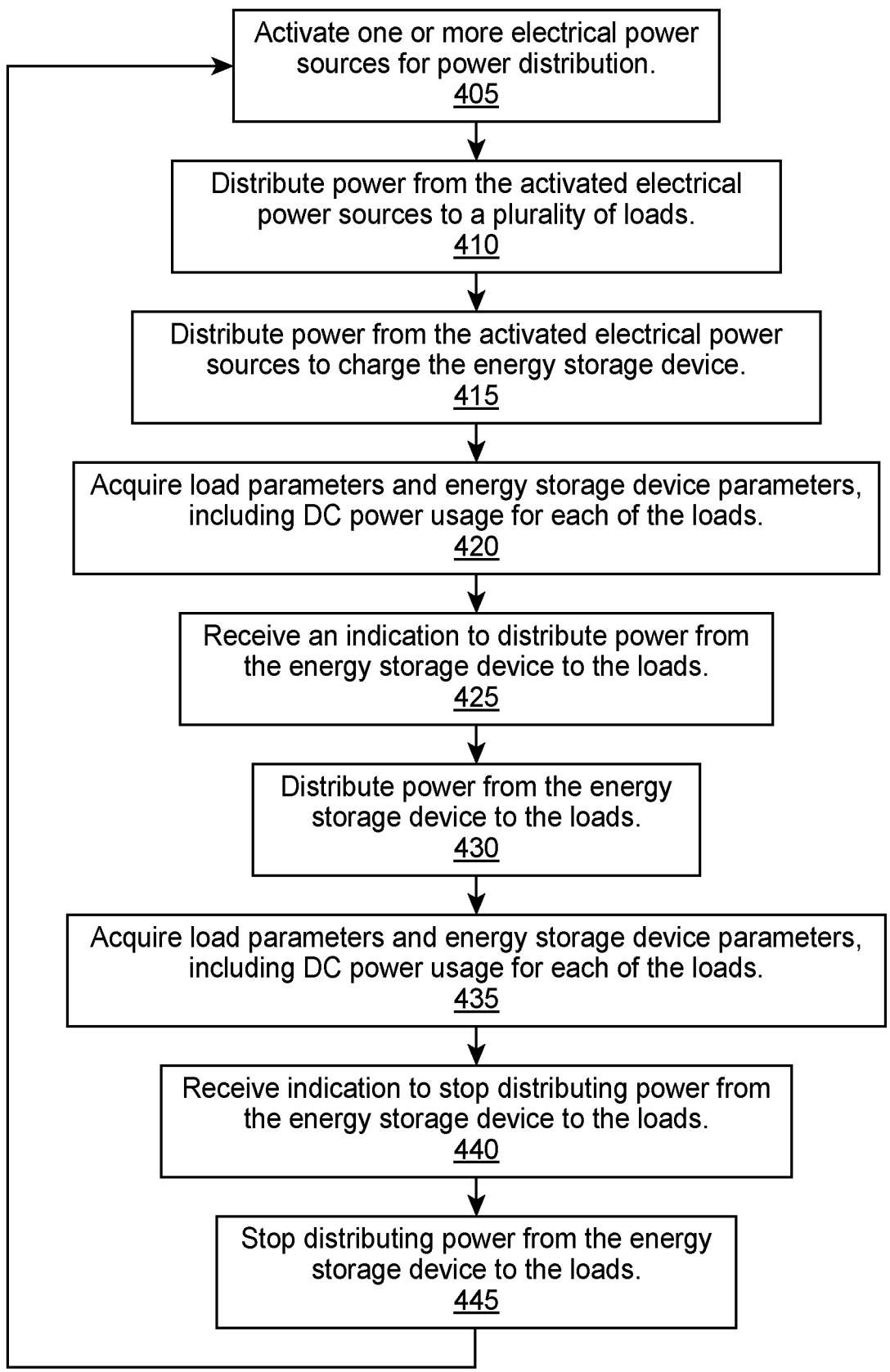
FIG. 4 illustrates a flow chart for an example method of storing energy and distributing power for communications equipment in a wireless communication network, according to an embodiment.

FIG. 4 illustrates a flow chart for an example method of storing energy and distributing power for communications equipment in a wireless communication network, according to an embodiment. The description of FIG. 4 is provided in conjunction with reference to the FIGS. 1-3. It should be appreciated that the method of FIG. 4 is not limited to the embodiments shown in FIGS. 1-3 and that the underlying principles of the method can be applied to varying embodiments, such as those having different electrical power sources 102 than those shown in FIGS. 1-3. Furthermore, it should be appreciated that the discussion provided for the features and functions described in FIGS. 1-3 can also be applicable here, and that the entire description of each feature and function is not repeated here for the sake of brevity and clarity.

At block 405 of a method 400 of storing energy and distributing power, one or more of the electrical power sources 102 is activated (or enabled) for power distribution to the loads 103, the energy storage device 104, or both. For example, the power source control module 204, the energy source control module 205, and the load control module 206 work in conjunction to determine which of the electrical power sources 102 to select and activate for power distribution to the loads 103 and to the energy storage device 104. For instance, the power source control module 204 can activate the DC/DC converter 108 to provide DC power output from the DC/DC converter 108, or can control the ATS 109 to activate any of the electrical power sources 102b, 102c, and 102d to provide DC power output from the AC/DC rectifier 110. In one embodiment, only one of the electrical power sources 102 is activated at a time to power the loads 103 and charge the energy storage device 104. In another embodiment, more than one of the electrical power sources 102 can be activated at a time to power the loads 103 and charge the energy storage device 104.

At block 410, DC power derived from the activated electrical power sources 102 is distributed to power the loads 103. At block 415, the DC power is distributed to charge the energy storage device 104. In an embodiment where only one of the electrical power sources 102 is activated at a time, the resulting DC power generated is distributed to power the loads 103 and charge the energy storage device 104 when required. In another embodiment where more than one of the electrical power sources 102 is activated at a time, the total DC power generated can be distributed to power the loads 103 and charge the energy storage device 104 when required. The loads 103 and the energy storage device 104 can be powered collectively from the same activated electrical power sources 102 or individually from different activated electrical power sources. For example, the loads 103 can be powered by DC power derived from the AC electricity grid 102*b*, and the energy storage device 104 can be charged by DC power derived from the solar panels 102*a*.

The energy storage control module 205 determines when the energy storage device 104 requires charging and distributes power from an activated electrical power source 102 to the energy storage device 104. The charging requirements can be based on charge settings. The charge settings can be established according to any variety of schemes as desired for an intended design or application. Example charge settings can include, but are not limited to charging the energy storage device 104: when an activated electrical power source becomes insufficient to power the loads, unstable, or unavailable; when the state of charge of the energy storage device 104 drops below a threshold value, which can be measured by the measurement module 208; when power to the loads is being switched between electrical power sources; during certain times of the day (e.g., during daylight hours using the solar panels 102*a*); etc. The charge settings can be established by a technician or system administrator, or dynamically adjusted by software algorithms based on parameters or statuses of the loads 103 and the energy storage device 104.

The energy storage control module 205 works in conjunction with the power source control module 204 to determine which of the electrical power sources 102 to activate (and when) to charge the energy storage device 104. For example, the charge settings can include an order for charging the energy storage device 104, such as charging with power from the solar panels 102*a* when possible and with power from the AC electricity grid 102*b* when power from the solar panels 102*a* is insufficient (e.g., on cloudy days). It is appreciated that the charge settings can be established according to any variety of charging schemes as desired for an intended design or application.

At block 420, load parameters and energy storage device parameters are acquired, including the DC power usage for each of the loads 103. For example, the measurement module 208 can acquire various measurements, such as voltage, current, power, state of charge, temperature, etc., for the loads 103 and the energy storage device 104. The measurements can be acquired from various meters (e.g., the DC metering module 106) and sensors (e.g., a temperature sensor). The power source control module 204 can utilize the acquired parameters to monitor and control the output voltage and current from the AC/DC rectifier 110 or the AC/DC rectifier 110 in a manner to optimally power the loads 103. Some of the parameters can be calculated by the measurements module 208. For example, DC power usage can be calculated based on current and voltage measurements, and state of charge can be calculated based on voltage, current and temperature. In an embodiment, the load parameters and energy storage device parameters (e.g., the DC power usage for the loads 103) are sent to the remote server 304 for storage or additional processing. For example, the DC energy usage can be stored in corresponding load profiles as described herein. For instance, billing invoices for operators can be generated based on the load profiles and DC energy usage. As another example, the remote server 304 can implement software algorithms (e.g., machine learning and artificial intelligence based algorithms) to analyze the parameters and other system data to determine the most efficient configuration of the system 101, such as settings for the charge settings, the load priority settings, etc. The parameters can also be analyzed to determine whether to shed one or more of the loads 103.

At block 425, an indication to distribute power from the energy storage device 104 to the loads 103 is received. For example, the energy storage control module 205 can trigger power distribution from the energy storage device 104 to the loads 103 when an event from the charge settings has been detected—e.g., an indication that an activated electrical power source becomes insufficient to power the loads, unstable, or unavailable; an indication that the state of charge of the energy storage device 104 drops below a threshold value; an indication that power to the loads is being switched between electrical power sources; an indication of a scheduled time (during daylight hours using the solar panels 102*a*); or an other event as desired for an intended design or application. The measurement module 208 can be used to detect when an event from the charge settings has occurred.

At block 430, power from the energy storage device is distributed to the loads. For example, the energy storage control module 205 distributes DC power from the energy storage device 104 to the loads 103. In one embodiment, power from the electrical power sources 102 is not distributed to power the loads 103 while the energy storage device 104 powers the loads 103. In such case, the power source control module 204 deactivates the activated electrical power sources. In another embodiment, power from the energy storage device 104 can supplement power from the activated electrical power sources 102 to power the loads 103.

At block 435, the load parameters and energy storage device parameters are acquired, as similarly described for block 420. The measurement module 208 can acquire the DC power usage for each of the loads 103 when the energy storage device 104 is powering the loads 103. Some or all of the system parameters can be sent to the remote server 304 for storage or additional processing as described for block 420. For instance, the DC energy usage can be stored in corresponding load profiles and used to generate customer billing invoices, as described herein.

At block 440, an indication to stop distributing power from the energy storage device 104 to the loads 103 is received. For example, the energy storage control module 205 can stop power distribution from the energy storage device 104 to the loads 103 when an event from the charge settings has been detected—e.g., an indication that an electrical power source 102 can provide sufficient power to the loads 103, has stabilized, or has become available; an indication that the state of charge of the energy storage device 104 becomes zero (or drops below a threshold value); an indication that a process to switch between electrical power sources to power the loads has been completed; an indication of a scheduled time (during blackout hours or when power is not required); etc. The measurement module 208 can be used to detect when an event from the charge settings has occurred.

At block 445, power distribution from the energy storage device 104 to the loads 103 is stopped. In an embodiment where power from the energy storage device 104 was powering the loads 103 without power from any electrical power sources 102, one or more electrical power sources can be selected to power the loads 103, as indicated by the reference arrow back to block 405. Power from the activated electrical power source is then used to charge the energy storage device as established by the charge settings (e.g., as discussed in blocks 410 and 415).

In another embodiment where power from the energy storage device 104 was supplementing power from an activated electrical power sources 102 to power the loads 103, the power from the activated electrical power source continues to power the loads after power distribution from the energy storage device 104 is stopped. The method 400 can be repeated, as represented by the arrow back to block 405. For instance, the power from the activated electrical power source can remain active to power the loads 103 (block 405) and charge the energy storage device 104 as established by the charge settings (block 410). Alternatively, another electrical power sources 102 can be selected to power the loads (block 405) and charge the energy storage device 104 as established by the charge settings (block 410).

In certain instances, the electrical power sources 102 selected and activated can be changed before the energy storage device powers the loads 103. For example, the AC electricity grid 102b can be initially activated to power the loads 103, and the solar panels 102a can be selected to replace the AC electricity grid 102b when it lacks sufficient power. The energy storage device 104 can be configured to power the loads when the solar panels 102 also become insufficient to power the loads 103.

Figure 5:
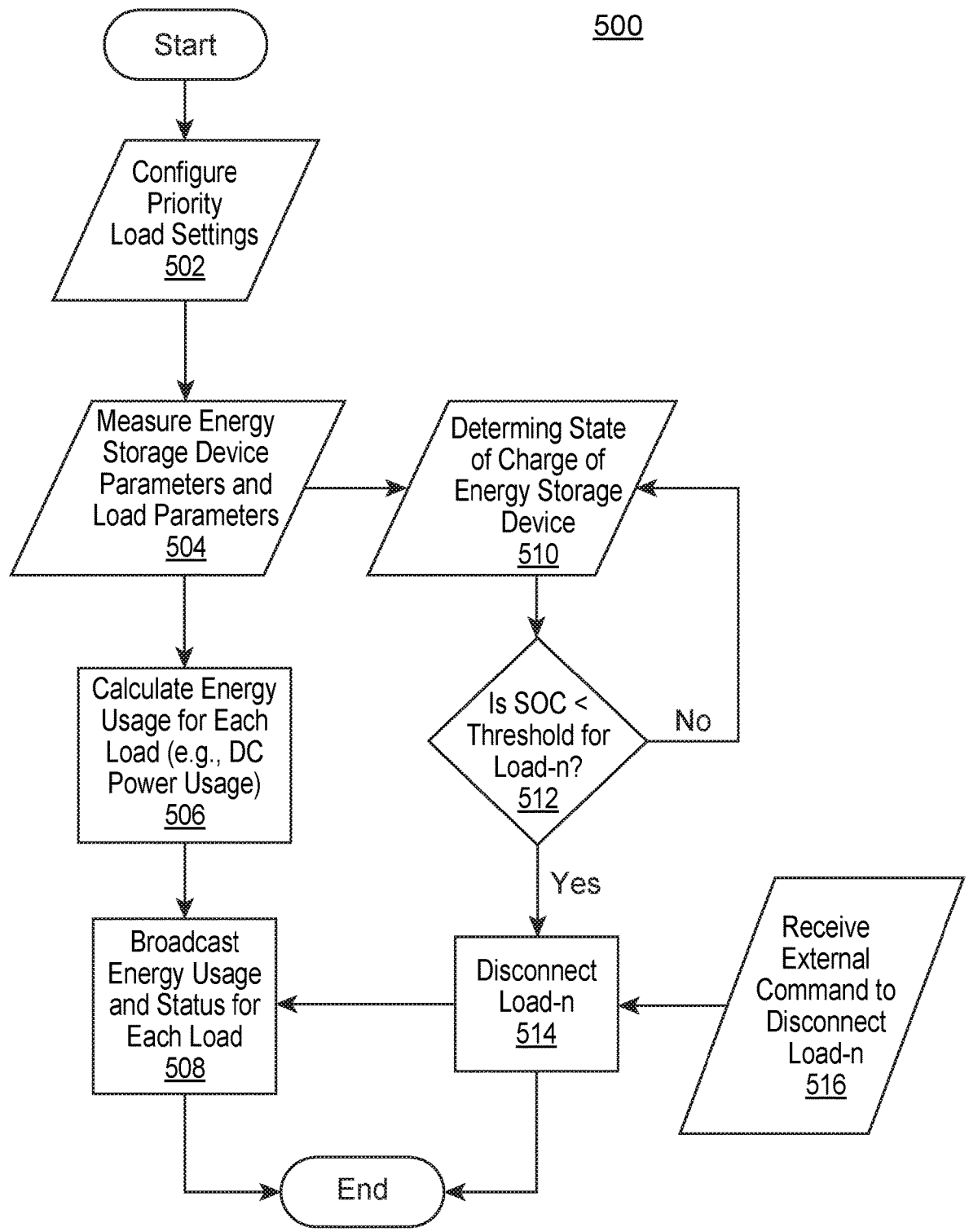
FIG. 5 illustrates a flowchart for an example method of shedding one or more loads from an energy storage and power distribution system, according to an embodiment.

FIG. 5 illustrates a flowchart for an example method of shedding one or more loads from an energy storage and power distribution system for powering communications equipment in a wireless communication network, according to an embodiment. The description of FIG. 5 is provided in conjunction with reference to the FIGS. 1-4. It should be appreciated that the method of FIG. 5 is not limited to the embodiment shown in FIGS. 1-4 and that the underlying principles of the method can be applied to varying embodiments, such as those having different electrical power sources 102 than those shown in FIGS. 1-4. Furthermore, it should be appreciated that the discussion provided for the features and functions described in FIGS. 1-4 can also be applicable here, and that entire description of each feature and function is not repeated here for the sake of brevity and clarity.

At block 502 of the method 500, priority load settings are configured. The priority load settings establish priority of each of the loads. For instance, all of the loads 103 can be assigned a priority (e.g., ranked), or alternatively only less critical loads can be assigned a low priority. For instance, the priority of a load can be based on, for example, how important it is for the load to remain powered (or not lose power); how much power the load consumes; what technology is employed in the load (e.g., BTSs employing 2G, 3G, 4G, or 5G mobile network technologies); operator priority; operator preference; loads having service to a greater user base or geographic area; etc. The operator priority can be based on the critical nature (e.g., severity of consequences) for an operator's load to remain powered without interruption, or based on customer subscription (e.g., operators paying more money for a better subscription with greater assurances that their load remains powered). It should be appreciated that the priority load settings can be based on other factors than those listed, and can even be arbitrarily set, such as if the critical nature of the loads are equivalent.

The configuration of the priority load settings can be implemented in the load control module 206, for instance. The priority load settings can be configured by a technician or system administrator or determined by software based on a power conservation algorithm that maximizes the conservation and efficiency of the energy storage and power distribution 101. The priority load settings can be configured at various times (e.g., upon installation or changes to the loads, upon changes in customer subscriptions, upon identification of faulty equipment, etc.), or can be dynamically adjusted based on software that analyzes the system parameters and maximizes efficiency.

At block 504, load parameters and energy storage device parameters are measured. For example, the measurement module 208 can acquire measurements for the voltage and current output to each of the loads 103, as well as the temperature at each of the loads. The measurement module 208 can acquire measurement for the voltage and current output by the energy storage device 104, as well as the temperature for the energy storage device 104. At block 506, energy usage is calculated for each load. For example, the DC power usage can be calculated by the measurement module 208 based on the voltage and current that is output to each of the loads 103. The DC energy usage can be based on the DC power usage over a given time period. At block 508, the energy usage is transmitted (e.g., broadcasted) to the remote server 304. For example, the DC power usage (or DC energy usage) can be sent to the remote server 304 and stored in load profiles specific to the load 103. The DC power usage and load profiles can be used to generate reports related to the power usage of each load, to generate billing invoices for customers, etc.

When the energy storage device 104 is powering the loads 103 (e.g., without power from any of the electrical power sources 102), blocks 510 and 512 can be performed to determine whether to shed any of the loads 103. At block 510, the state of charge of the energy storage device 104 is determined. For example, the measurement module 208 can calculate the state of charge based on the output voltage, output current, and temperature for the energy storage device 104. At block 512, the state of charge is compared to a threshold value of power required to power the loads 103. For example, the load control module 206 compares the state of charge of the energy storage device 104 to the threshold value of power required to power the loads 103. If the state of charge is not less than the threshold value, then the load control module 206 continues to distribute power from the energy storage device 104 to the loads 103. The load control module 206 continues to monitor the state of charge of the energy storage device 104, as represented by the arrow back to block 510. For instance, the state of charge can be monitored continuously or at predetermined intervals of time (e.g., every second, every 5 seconds, every 30 seconds, every minute, or any other interval of time as desired).

If, at block 512, the state of charge is less than the threshold value, then the load control module 206 sheds one or more of the loads 103, as represented at block 514. For example, the loads to be shed can be selected by the load control module 206 based on the load priority settings configured at block 502. The For instance, the load priority settings can be configured to shed only the lowest priority loads when the state of charge is below the threshold value to power the loads 103. In an embodiment, the load control module 206 can be configured to calculate the threshold values to power each of the loads 103, and based thereon, shed one or more of the loads necessary to bring the state of charge at or above the threshold value to power the remaining loads that are not shed. This can also be performed in addition to other priority load settings—e.g., by only considering loads with sufficiently low priority. In one embodiment, the load control module 206 is configured to only shed a single load when the state of charge is less than the threshold value. In another embodiment, one or more loads can be shed when the state of charge is less than the threshold value of power required for all loads 103.

Independent of the state of charge analysis performed at blocks 510 and 512, an external command can also be received to shed one or more of the loads. At block 516, an external command to shed one of the loads 103 is received. For example, the load control module 206 can receive the external command from the remote server 304 or the user device 306. For instance, the external command can be generated by a technician or system administrator using the user device 306. Alternatively, the external command can be generated by the remote server 304 based on a software algorithm (e.g., machine learning or artificial intelligence) that analyzes the system parameters and selects the appropriate loads to shed. The external command to shed a load can be generated for any of a variety of reasons. For example, the external command can be generated to shed a load because an operator fails to pay its bills. As another example, the external command can be generated to shed a load based on whether the load exceeds a maximum power usage limit assigned to the load. For instance, operators of loads may pay for certain levels of power usage, such as with subscriptions based on maximum power usage limits. Once the external command is received, the load control module 206 sheds the corresponding load, as represented by the block 514.

When loads are shed at block 514, the load control module 206 can generate load status data that indicates the status of each of the loads 103. The load status data can then be sent to the remote server 304, as represented by block 508. For example, the load status data can indicate various states of the load—e.g., enable, disabled, enabled within limits, enabled out of limits, etc.

It should be appreciated that the methods of FIGS. 4 and 5 can be performed separately or simultaneously. In certain aspects of the present disclosure, a non-transitory computer-readable medium is provided that stores computer-executable instructions that, when executed by a processor, cause a computer system to perform the method 400, the method 500, or both.

Figure 6:
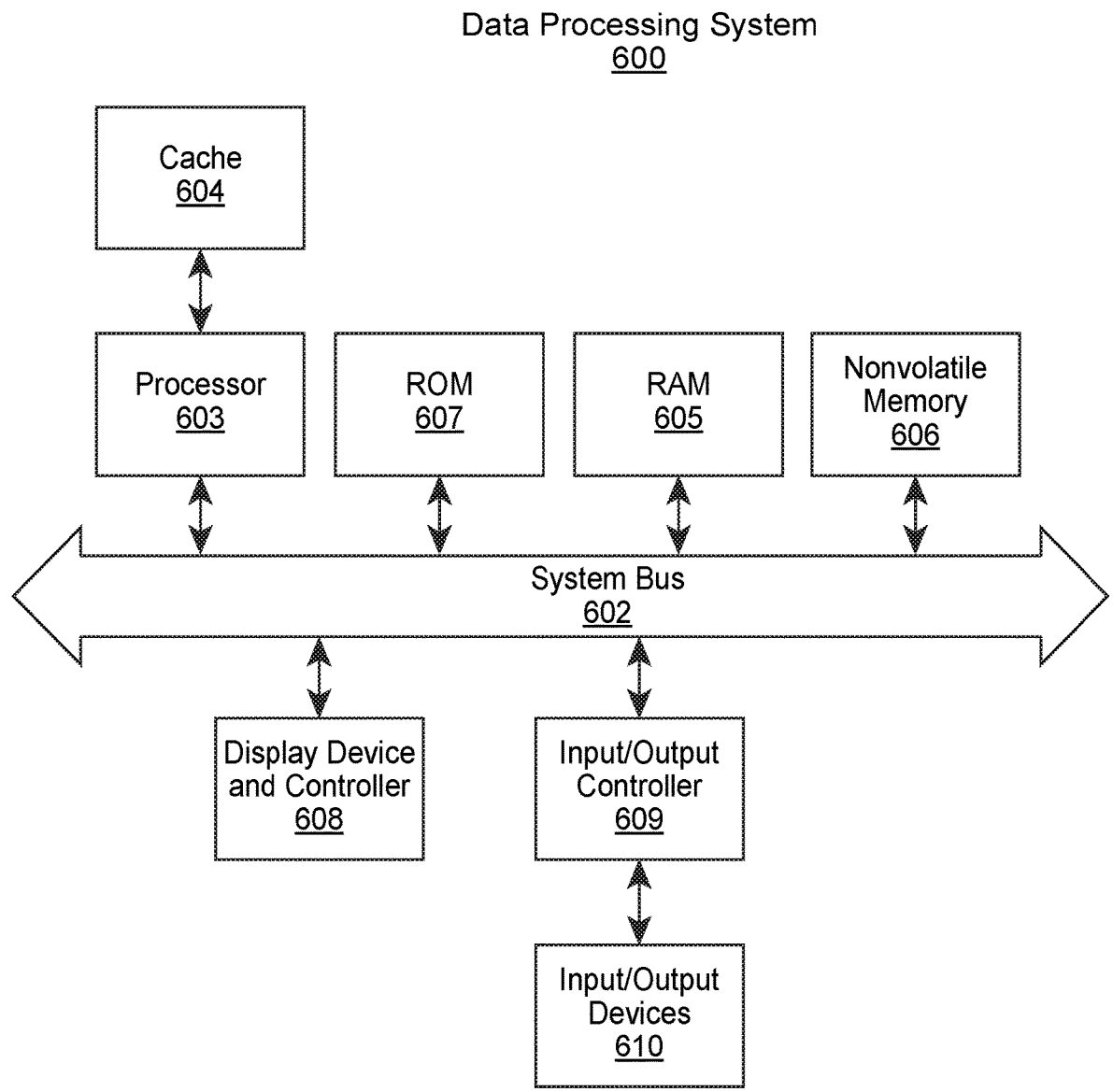
FIG. 6 depicts a block diagram of an exemplary data processing or computer system, according to an embodiment.

FIG. 6 depicts a block diagram of an exemplary data processing system or computer system, according to an embodiment. Note that while FIG. 6 illustrates various components of a computer system, it is not intended to represent any particular architecture or manner of interconnecting the components. The system 600 shown in FIG. 6 may represent an example data processing system or computer system, such as comprised in the energy storage and power distribution system 101, the server 304, or the user device 306 for instance. It is also appreciated that networked computers and other data processing systems which have fewer components, or more components, may also be implemented as the system 600.

As shown, the system 600 includes a system bus 602, which is coupled to a microprocessor 603, a Read-Only Memory (ROM) 607, a volatile Random Access Memory (RAM) 605, as well as other nonvolatile memory 606. In the illustrated embodiment, microprocessor 603 is coupled to cache memory 604. A system bus 602 can be adapted to interconnect these various components together and also interconnect components 603, 607, 605, and 606 to other devices, such as a display controller and display device 608, and to peripheral devices such as input/output ("I/O") devices 610. Types of I/O devices can include keyboards, modems, network interfaces, printers, scanners, video cameras, or other devices well known in the art. Typically, I/O devices 610 are coupled to the system bus 602 through I/O controllers 609. In one embodiment the I/O controller 609 includes a Universal Serial Bus ("USB") adapter for controlling USB peripherals or other type of bus adapter.

RAM 605 can be implemented as dynamic RAM ("DRAM"), which requires power continually in order to refresh or maintain the data in the memory. The other nonvolatile memory 606 can include a magnetic hard drive, magnetic optical drive, optical drive, DVD RAM, solid-state storage drive, or other type of memory system that maintains data after power is removed from the system. While FIG. 6 shows that nonvolatile memory 606 as a local device coupled with the rest of the components in the system 600, it will be appreciated by skilled artisans that the described techniques may use a nonvolatile memory remote from the system, such as a network storage device coupled with the system 600 through a network interface, such as a modem, Ethernet interface, or any other standard or proprietary interface.

Throughout the foregoing description, and for the purposes of explanation, numerous specific details are set forth in order to provide a thorough understanding of the described techniques. It will be apparent, however, to one skilled in the art that these techniques can be practiced without some of these specific details. Although various embodiments that incorporate these teachings have been shown and described in detail, those skilled in the art could readily devise many other varied embodiments or mechanisms to incorporate these techniques. Also, embodiments can include various operations as set forth above, fewer operations, or more operations, or operations in an order. Accordingly, the scope and spirit of the invention should only be judged in terms of any accompanying claims that may be appended, as well as any legal equivalents thereof.

Reference throughout the specification to "one embodiment" or "an embodiment" is is used to mean that a particular feature, structure or characteristic described in connection with an embodiment is included in at least one embodiment. Thus, the appearance of the expressions "in one embodiment" or "in an embodiment" in various places throughout the specification are not necessarily referring to the same embodiment. Further, the particular features, structures or characteristics may be combined in any suitable manner in one or several embodiments. Although the present invention has been described above with reference to specific embodiments, it is not intended to be limited to the specific form set forth herein. Rather, embodiments other than those specific described above are equally possible within the scope of any accompanying claims. Moreover, it should be appreciated that the terms "comprise/comprises" or "include/includes", as used herein, do not exclude the presence of other elements or steps. Furthermore, although individual features may be included in different claims, these may possibly advantageously be combined, and the inclusion of different claims does not imply that a combination of features is not feasible and/or advantageous. In addition, singular references do not exclude a plurality. Finally, reference signs in the claims are provided merely as a clarifying example and should not be construed as limiting the scope of the claims in any way.

For purposes of explanation, numerous specific details are set forth in order to provide a thorough understanding of the description. It should be apparent, however, to one skilled in the art that embodiments of the disclosure can be practiced without these specific details. In some instances, modules, structures, processes, features, and devices are shown in functional block diagram form in order to avoid obscuring the description. In other instances, functional block diagrams and flow diagrams are shown to represent data and logic flows. The components of block diagrams and flow diagrams (e.g., modules, blocks, structures, devices, features, etc.) may be variously combined, separated, removed, reordered, and replaced in a manner other than as expressly described and depicted herein. It should be appreciated that the block diagrams may include additional components that are not necessarily shown or described, but which have been left out for the sake of clarity and brevity.

Various components and modules described herein may include hardware, software, or a software, or a combination of software and hardware. Certain components and modules may be implemented as hardware modules, software modules, combination of software and hardware modules, special-purpose hardware (e.g., application specific hardware, ASICs, DSPs, etc.), embedded controllers, hardwired circuitry, hardware logic, etc. Software content (e.g., data, instructions, and configuration) may be provided via an article of manufacture including a non-transitory, tangible computer or machine-readable storage medium, which provides content that represents instructions that can be executed. The content may result in a computer performing various functions/operations described herein.

In general, the processes and features described herein may be implemented as part of an operating system or a specific application, component, program, object, module, or series of instructions referred to as "programs". For example, one or more programs may be used to execute specific processes described herein. The programs typically comprise one or more instructions in various memory that, when read and executed by a processor, cause the processor to perform operations to execute the processes and features described herein. The processes and features described herein may be implemented in software, firmware, hardware (e.g., an application specific integrated circuit, or a field-programmable gate array (FPGA)), or any combination thereof. For example, the controllers described herein can include one or more processors (or processing units) that may be implemented as described above to execute the instructions. The term "processor" is used broadly herein and may include one or more processing units or circuitry, such as one or more embedded or non-embedded processors, microprocessors, hard and soft microprocessor cores, etc.

In an implementation, the processes and features described herein may be implemented as a series of executable modules run by a processor (e.g., in a computer system, individually, collectively in a distributed computing environment, embedded in a controller, etc.). The foregoing modules may be realized by hardware, executable modules stored on a computer-readable medium (or machine-readable medium), or a combination of both. For example, the modules may comprise a plurality or series of instructions to be executed by a processor in a hardware system. Initially, the series of instructions may be stored in memory, such as on a storage device. However, the series of instructions can be stored on any suitable computer readable storage medium. Furthermore, the series of instructions need not be stored locally, and could be received from a remote storage device, such as a server on a network, via the network interface. In various implementations, a module or modules can be executed by a processor or multiple processors in one or multiple locations, such as multiple servers in a parallel processing environment A computer or machine readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.); or any type of medium suitable for storing, encoding, or carrying a series of instructions for execution by a processor to perform any one or more of the processes and features described herein. The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

What is claimed is:

1. An energy storage and power distribution system for powering telecommunications load equipment at a mobile tower site in a wireless communication network, comprising:

an energy storage device comprising one or more batteries;

a controller coupled to the energy storage device and configured to couple to one or more electrical power sources, the controller further configured to:

control distribution of power from the one or more electrical power sources and power from the energy storage device to a plurality of loads at the mobile tower site, the plurality of loads comprising a plurality of telecommunications load equipment; and charge the energy storage device with the power from the one or more electrical power sources;

a plurality of load control interfaces coupled to the controller and configured to couple to the plurality of telecommunications load equipment to enable distribution of DC power to the plurality of telecommunications load equipment; and a DC metering module coupled to the plurality of load control interfaces, wherein the DC metering module is configured to measure the distribution of DC power from the one or more electrical power sources and the energy storage device to the plurality of telecommunications load equipment so as to acquire DC power usages for each of the plurality of telecommunications load equipment at the mobile tower site.

2. The energy storage and distribution system of claim 1, further comprising: a transmitter coupled to the controller; and a remote server located remote from the energy storage device, the controller, the DC metering module, the plurality of load interfaces, and the transmitter; wherein the controller is configured to transmit the DC power usages for each of the plurality of telecommunications load equipment to the remote server via the transmitter.

3. The energy storage and distribution system of claim 2, further comprising a database, wherein the DC power usages for each of the plurality of telecommunications load equipment are saved to corresponding load profiles stored in the database, and wherein the remote server is configured to generate billing invoices based on the DC power usages and the corresponding load profiles.

4. The energy storage and distribution system of claim 1, wherein the one or more electrical power sources comprises at least one selected from the group consisting of: solar panels, an AC electricity grid, a diesel generator, a fuel cell, and a wind turbine system.

5. The energy storage and distribution system of claim 4, further comprising a DC/DC converter coupled to the controller;
wherein the one or more electrical power sources comprises the solar panels and the AC electricity grid; and
wherein the DC/DC converter is configured to couple to the solar panels to enable power distribution from the solar panels to the plurality of telecommunications load equipment.

6. The energy storage and distribution system of claim 5, further comprising:
the solar panels coupled to the DC/DC converter; and
a transmitter coupled to the controller; and a remote server located remote from the energy storage device, the controller, the DC metering module, the plurality of load interfaces, and the transmitter; wherein the controller is configured to transmit the DC power usages for each of the plurality of telecommunications load equipment to the remote server via the transmitter.

7. The energy storage and distribution system of claim 1, wherein the controller is further configured to shed one or more of the plurality of telecommunications load equipment based on configured load priority settings that comprise settings to prioritize load shedding based on the acquired DC power usages for the plurality of telecommunications load equipment.

8. The energy storage and distribution system of claim 7, wherein the controller is further configured to shed one or more of the plurality of telecommunications load equipment based on a state of charge of the energy storage device.

9. The energy storage and distribution system of claim 1, further comprising:
a portable housing for enabling the energy storage and power distribution system to be moved to and coupled to the mobile tower site; and
a DC/DC converter coupled to the controller;
wherein the one or more electrical power sources comprises solar panels and is absent an AC electricity grid;
wherein the DC/DC converter is configured to couple to the solar panels to enable power distribution from the solar panels to the plurality of telecommunications load equipment absent the AC electricity grid; and
wherein the energy storage device, the controller, the plurality of load control interfaces, the DC/DC converter, and the DC metering module are disposed in the portable housing.

10. A method of storing and distributing energy with an energy storage and power distribution system for powering telecommunications load equipment at a mobile tower site in a wireless communication network, comprising:
activating, by a controller of the energy storage and power distribution system, one or more electrical power sources for power distribution to a plurality of loads at the mobile tower site, the plurality of loads comprising a plurality of telecommunications load equipment;
distributing, by the controller, DC power derived from the activated one or more electrical power sources to the plurality of telecommunications load equipment;
distributing, by the controller, a portion of the DC power derived from the activated one or more electrical power sources to an energy storage device to charge the energy storage device, the energy storage device comprising one or more batteries; and
acquiring, by the controller, DC power usages for each of the plurality of telecommunications load equipment at the mobile tower site from a DC metering module coupled to a plurality of load control interfaces;
wherein the energy storage and power distribution system comprises:
the energy storage device;
the controller coupled to the energy storage device and configured to couple to the one or more activated electrical power sources, the controller further configured to:
control distribution of power from the one or more electrical power sources and power from the energy storage device to the plurality of telecommunications load equipment; and
charge the energy storage device with the power from the one or more electrical power sources;
the plurality of load control interfaces coupled to the controller and configured to couple to the plurality of telecommunications load equipment to enable distribution of DC power to the plurality of telecommunications load equipment; and
the DC metering module coupled to the plurality of load control interfaces, wherein the DC metering module is configured to measure the distribution of DC power from the one or more electrical power sources and the energy storage device to the plurality of telecommunications load equipment so as to acquire the DC power usages for each of the plurality of telecommunications load equipment at the mobile tower site.

11. The method of claim 10, further comprising:
receiving, by the controller, a first indication to distribute power from the energy storage device to the plurality of telecommunications load equipment;
distributing, by the controller, DC power from the energy storage device to the plurality of telecommunications load equipment to power the plurality of telecommunications load equipment in response to the receiving of the first indication;
receiving, by the controller, a second indication to stop distributing power from the energy storage device to the plurality of telecommunications load equipment; and
stopping distribution of the DC power from the energy storage device to the plurality of telecommunications load equipment in response to the receiving of the second indication.

12. The method of claim 11, further comprising:
after receiving the second indication to stop distributing power from the energy storage device to the plurality of telecommunications load equipment:
activating, by the controller, the one or more first electrical power sources for power distribution to a plurality of telecommunications load equipment; and
distributing, by the controller, DC power derived from the activated one or more electrical power sources to the plurality of telecommunications load equipment;
wherein the distribution of DC power derived from the activated one or more electrical power sources to the plurality of telecommunications load equipment deactivates when the DC power from the energy storage device is distributed to the plurality of telecommunications load equipment to power the plurality of telecommunications load equipment; and wherein the one or more activated electrical power sources is selected from a plurality of electrical power sources coupled to the controller.

13. The method of claim 10, further comprising:
configuring priority load settings in the energy storage and power distribution system, wherein the configured priority load settings comprise settings to prioritize load shedding based on the acquired DC power usages for the plurality of telecommunications load equipment;
acquiring, by the controller, load parameters and energy storage device parameters for the plurality of telecommunications load equipment and the energy storage device; and
shedding, by the controller, one or more of the plurality of telecommunications load equipment based on the configured load priority settings and the acquired load parameters and the energy storage device parameters.

14. The method of claim 13, wherein the shedding of the one or more plurality of telecommunications load equipment is based on a state of charge of the energy storage device.

15. An energy storage and power distribution system for powering telecommunications load equipment at a mobile tower site in a wireless communication network, comprising:
an energy storage device comprising one or more batteries;
a controller coupled to the energy storage device and configured to couple to one or more electrical power sources, the controller further configured to:
control distribution of power from the one or more electrical power sources and power from the energy storage device to a plurality of loads at the mobile tower site, the plurality of loads comprising a plurality of base transceiver station (BTS) equipment employing different wireless network technologies, wherein the wireless network technologies are selected from the group consisting of: second-generation (2G), third-generation (3G), fourth-generation (4G), and fifth-generation (5G) mobile network technologies; and
charge the energy storage device with the power from the one or more electrical power sources; and
a plurality of load control interfaces coupled to the controller and configured to couple to the plurality of BTS equipment to enable distribution of DC power to the plurality of BTS equipment;
wherein the controller is configured to shed one or more of the plurality of BTS equipment based on configured load priority settings that comprise settings to prioritize load shedding based on the wireless network technologies employed in the plurality of BTS equipment.

16. The energy storage and distribution system of claim 15, wherein the controller is further configured to shed one or more of the plurality of BTS equipment based on a state of charge of the energy storage device.

17. The energy storage and distribution system of claim 16, further comprising a transmitter coupled to the controller, wherein the transmitter is configured to communicate with a remote server located remote from the energy storage and distribution system, and wherein the controller is further configured to:
shed one or more of the plurality of BTS equipment in response to receiving an external command from the remote server; and
transmit load status data for the plurality of BTS equipment to the remote server.

18. The energy storage and distribution system of claim 15, wherein the configured priority load settings comprise settings that prioritize load shedding based on an operator priority for one or more operators of the plurality of BTS equipment.

19. The energy storage and distribution system of claim 15, wherein the plurality of BTS equipment comprises:
a first BTS equipment employing fifth-generation (5G) mobile network technology; and
a second BTS equipment employing a wireless network technology selected from the group consisting of: second-generation (2G), third-generation (3G), and fourth-generation (4G), technologies;
wherein the controller is configured to prioritize load shedding by shedding the second BTS equipment instead of the first BTS equipment based on the second BTS equipment having a lower generation network technology than the first BTS equipment.

20. The energy storage and distribution system of claim 15, further comprising a portable housing enabling the energy storage and power distribution system to be moved to and coupled to the mobile tower site;
wherein the energy storage device, the controller, and the plurality of load control interfaces are disposed in the portable housing.

21. A method of shedding BTS equipment with an energy storage and power distribution system for telecommunications load equipment at a mobile tower site in a wireless communication network, the method comprising:
configuring priority load settings in an energy storage and power distribution system, the energy storage and power distribution system comprising:
an energy storage device comprising one or more batteries;
a controller coupled to the energy storage device and configured to couple to one or more electrical power sources, the controller further configured to:
control distribution of power from the one or more electrical power sources and power from the energy storage device to a plurality of loads at the mobile tower site, the plurality of loads comprising a plurality of base transceiver station (BTS) equipment employing different wireless network technologies, wherein the wireless network technologies are selected from the group consisting of: second-generation (2G), third-generation (3G), fourth-generation (4G), and fifth-generation (5G) mobile network technologies; and
charge the energy storage device with the power from the one or more electrical power sources; and
a plurality of load control interfaces coupled to the controller and configured to couple to the plurality of BTS equipment to enable distribution of DC power to the plurality of BTS equipment;
acquiring, by the controller, load parameters and energy storage device parameters for the plurality of BTS equipment and the energy storage device;
wherein the configuring of the priority load settings comprises configuring settings to prioritize load shedding based on the wireless network technologies employed in the plurality of BTS equipment; and
shedding, by the controller, one or more of the plurality of BTS equipment based on the wireless network technologies employed in the plurality of BTS equipment.

22. The method of claim 21, further comprising acquiring, by the controller, a state of charge of the energy storage device, wherein the shedding of one or more of the plurality of BTS equipment is based on the state of charge of the energy storage device.

23. The method of claim 22, further comprising shedding, by the controller, one or more of the plurality of BTS equipment in response to receiving an external command;
   wherein the energy storage and power distribution system further comprises a transmitter coupled to the controller, wherein the transmitter is configured to communicate with a remote server located remote from the energy storage and distribution system, and wherein the controller is further configured to:
      shed one or more of the plurality of BTS equipment in response to receiving the external command from the remote server; and
      transmit load status data for the plurality of BTS equipment to the remote server.

24. The method of claim 21, wherein the configuring of the priority load settings comprises configuring of settings based on an operator priority for one or more operators of the plurality of BTS equipment.

25. The method of claim 21, wherein the plurality of BTS equipment comprises:
   a first BTS equipment employing fifth-generation (5G) mobile network technology; and
   a BTS equipment employing a wireless network technology selected from the group consisting of: second-generation (2G), third-generation (3G), and fourth-generation (4G) technologies;
   wherein the controller is configured to prioritize load shedding by shedding the second BTS equipment instead of the first BTS equipment based on the second BTS equipment having a lower generation network technology than the first BTS equipment.

* * * * *